Dec. 2, 1958 W. J. OESTREICHER 2,863,079

MASKING DEVICES FOR COLOR TELEVISION SCREEN OR THE LIKE

Filed May 27, 1955

INVENTOR.
WARREN J. OESTREICHER

BY Theodore Haque [signature]

ATTORNEY

United States Patent Office 2,863,079

Patented Dec. 2, 1958

2,863,079

MASKING DEVICES FOR COLOR TELEVISION SCREEN OR THE LIKE

Warren J. Oestreicher, Flushing, N. Y., assignor to Kendon Electronics, Inc., a corporation of New York Application May 27, 1955, Serial No. 511,660

4 Claims. (Cl. 313—85)

This invention relates to masking devices for color television or any other type of multi-element on mosaic screen and more specifically to a so-called parallel or aperture mask for alignment with a multicolor screen.

In the past aperture masks, especially those of the planar type, had to be mounted on strong frames in cathode ray tubes and they had to be under sufficient stress to keep the mask taut under all possible temperature conditions prevailing in such cathode ray tubes.

This stress had to be of necessity of a magnitude approaching the yielding point of the material involved, thus resulting in a non-uniform distortion of the mask due to inhomogeneities of the mask material, causing loss of interchangeability and color misregistration.

In addition, the magnitude of the stress involved required strong and therefore heavy frames difficult to manufacture and to assemble.

It is an object of this invention to produce an aperture mask of a materially reduced stress requirement.

Another object of the invention is a mask mounted in a relatively light tensioning frame.

A further object of the invention is a stress relieving aperture pattern or configuration which serves to equalize local stresses over a relatively large mask area, thus reducing the magnitude of local displacement.

Still another object of the invention is a process for the manufacture of a stress relieved mask including the derivation of a specific stress reducing pattern or configuration.

Still further an object of the invention is to form the stress relieving pattern into apertures which present a relatively large portion of the entire surface of a mask.

A more specific object of the invention is the particular orientation of apertures in a number of linear arrays which are parallel to each other and alternately staggered with respect to each other and which in addition to stress reduction, involve a reduction of the moiré effect on the television screen.

Figure 1:
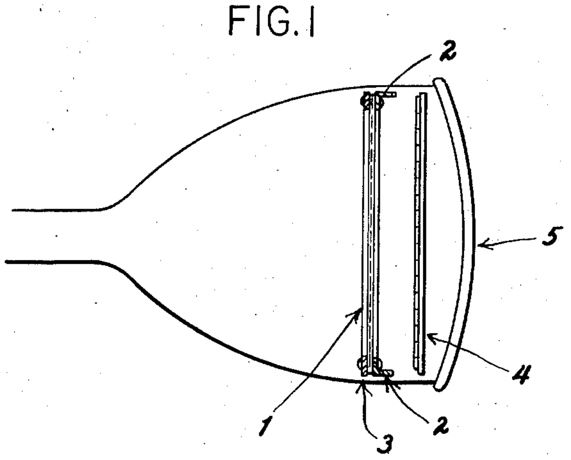
Figure 2:
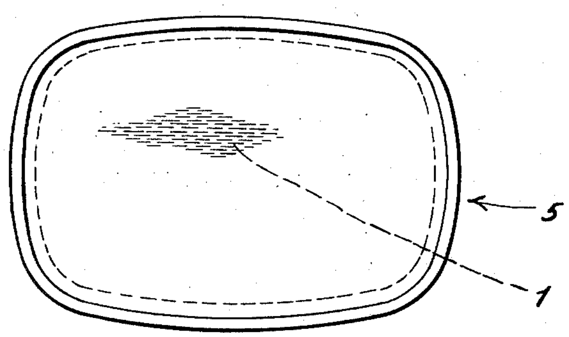

These and other objects of the invention will be more fully apparent from the drawings annexed herewith in which Figs. 1 and 2 in side and front elevations respectively, the former in section, show a mask mounted and embodying certain features of the invention.

Figure 3:
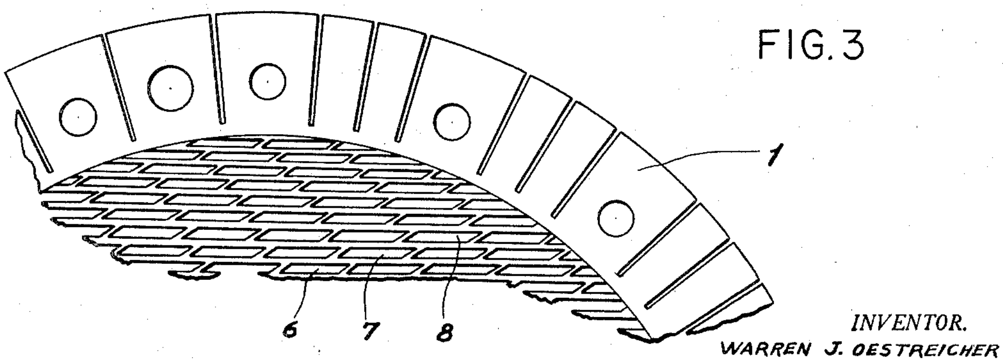

Fig. 3 shows a portion of the mask on an enlarged scale.

In Figs. 1 and 2 a mask 1 is mounted on frame 2 by clamping plate 3 by screwing, welding or any other appropriate means. Mask assembly 1, 2, 3 is mounted in a predetermined position with respect to phosphor plate 4 in otherwise well known manner, and it is further assembled into a demountable color television bulb 5 also in well known manner and therefore not disclosed in greater detail.

Fig. 3 shows a portion of mask 1 including a number of parallel longitudinal arrays of slots 6, 7, 8 arranged longitudinally displaced with respect to each other by about half of slot length.

While it is possible to arrange the mask in any appropriate manner and in alignment with the appropriate elements of the color screen, or at any desired angle with respect to the scanning direction of bulb 5, in accordance with a preferred embodiment of the invention, also described in copending patent application Serial No. 495,953 filed on March 22, 1955 it has been found that a horizontal alignment of the apertures provides higher apparent resolution of the required image.

In accordance with the invention an extremely simple manufacturing technique has been evolved. Usually, in the manufacture of such aperture masks, grading machines are used involving tolerances of the order of 1 percent of element dimension, approximately .001 inch having been found satisfactory.

In accordance with the invention a new manufacturing technique has been developed by engraving a master pattern by photoengraving on a relatively inexpensive photoengraving machine, whereby with a tolerance of the order indicated, a reduction in stress variation and an increase in aperture size is realized.

In one embodiment of this technique a mask was manufactured by photoengraving on a pigment coated vinyl or other plastic sheet; gratings have been realized, one consisting of slots of .007 inch width spaced apart on .002 inch centers and the other consisting of slots of .005 inch width spaced apart on .003 centers, and askewed 21° 49′ from parallelism.

After photographing the mask in negative form a mask positive was evolved which was then used for further reproduction of photoengraved sheet metal aperture masks in accordance with this invention.

In accordance with still another embodiment of this technique, the mask itself or a master or reproduction thereof can be used to produce uninterrupted or continuous type line elements corresponding to the elements of a phosphor screen by simply exposing the mask or a master or reproduction thereof to a light source in such a way or at such an angle that the metal webs separating the slots longitudinally will be caused to disappear in the reproduction. In this way, complete alignment of the mask with the color television screen is assured with a minimum of operations.

The invention is not limited to the particular dimensions, shapes and arrangements of apertures and aperture masks of color screen elements or of the entire color screen, but may be applied in any form or manner whatsoever, without departing from the scope of this disclosure.

I claim:

1. An aperture mask for a color television screen, comprising a number of parallel longitudinal arrays of longitudinal slots, adjacent arrays being staggered with respect to each other, and the small sides of the slots being parallel to each other and forming an angle other than 90° with the long sides of the slots, the latter being also parallel to each other, and peripheral mounting means on said mask.

2. Mask according to claim 1, wherein the slots of adjacent arrays are staggered with respect to each other by about half the slot length.

3. In a color television tube, a multi-element color screen and in alignment therewith a mask having a number of parallel longitudinal arrays of longitudinal slots, adjacent arrays being staggered with respect to each other, and the small sides of the slots being parallel to each other and forming an angle other than of about 20° with the long sides of the slots, which are also parallel, as to form substantially uninterrupted straight lines, and means for mounting said mask along its periphery, with slots extending into a direction substantially parallel to the direction of horizontal scanning.

4. Tube according to claim 3, wherein the slots of adjacent arrays are staggered with respect to each other by half the slot length and wherein said angle is 21°49′.

References Cited in the file of this patent

UNITED STATES PATENTS

| | | |
|---|---|---|
| 2,536,383 | Mears et al. | Jan. 2, 1951 |
| 2,625,734 | Law | Jan. 20, 1953 |
| 2,690,518 | Fyler et al. | Sept. 28, 1954 |
| 2,733,366 | Gimm et al. | Jan. 31, 1956 |